(12) United States Patent
Calvignac et al.

(10) Patent No.: US 6,522,271 B2
(45) Date of Patent: Feb. 18, 2003

(54) METHOD AND APPARATUS FOR TRANSMISSION ON A 2-BIT CHANNEL USING 3B/4B CODE

(75) Inventors: Jean Louis Calvignac, Cary, NC (US); Jeffrey James Lynch, Apex, NC (US); Daniel James Sucher, Rochester, MN (US); Fabrice Jean Verplanken, La Gaude (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/096,161

(22) Filed: Mar. 12, 2002

(65) Prior Publication Data

US 2002/0130797 A1 Sep. 19, 2002

Related U.S. Application Data

(60) Provisional application No. 60/276,739, filed on Mar. 16, 2001.

(51) Int. Cl.[7] .................................................. H03M 7/00
(52) U.S. Cl. ......................................... 341/102; 341/51
(58) Field of Search ............................ 341/102, 95, 58, 341/107, 59

(56) References Cited

U.S. PATENT DOCUMENTS

| | | | |
|---|---|---|---|
| 4,016,368 A | 4/1977 | Apple, Jr. et al. | 179/15 BS |
| 4,367,549 A | 1/1983 | Vachee | 370/91 |
| 4,581,737 A | 4/1986 | Sparrell | 370/110.1 |
| 4,622,666 A | 11/1986 | Graves et al. | 370/100 |
| 5,068,899 A | 11/1991 | Ellis et al. | 381/31 |
| 5,357,249 A | 10/1994 | Azaren et al. | 341/100 |
| 5,442,405 A | 8/1995 | Taniguchi et al. | 348/525 |
| 5,570,089 A | 10/1996 | Haas | 341/102 |
| 5,614,901 A | 3/1997 | Haas | 341/68 |
| 5,822,328 A | 10/1998 | Derby et al. | 370/507 |
| 6,058,149 A | 5/2000 | Sato | 375/365 |
| 6,198,753 B1 | 3/2001 | Virdee et al. | 370/509 |
| 6,356,215 B1 * | 3/2002 | Coene | 341/102 |

* cited by examiner

*Primary Examiner*—Brian Young
(74) *Attorney, Agent, or Firm*—Joscelyn G. Cockburn (57) ABSTRACT

A 2-bit communication channel is made to transmit complex data patterns by partitioning a digital string into 3-bit binary patterns which are encoded into 4 bits binary pattern and transmitted over the 2-bit communication channel in pairs using adjacent clock cycles on the 2-bit channel. Pre-defined ones of the 4-bit encoded data structures are used for framing on the channel and cannot be used to transmit data.

28 Claims, 7 Drawing Sheets

CLOCK

CODED PATTERN
TRANSMITTED IN 2
CONTIGUOUS
CYCLES

FIG. 2B

BIT A  1 0 0 0 0 0 0 0 1 0 0 1 0 1 1 0 1

BIT B  1 0 0 1 0 0 1 1 1 0 0 1 0 0 0 1 1

CODED (4b) PATTERNS: b1b2b3b4 b1b2b3b4 b1b2b3b4 b1b2b3b4 b1b2b3b4 b1b2b3b4 b1b2b3b4 b1b2b3b4
0 0 0 0 0 1 0 0 0 0 1 0 1 0 1 1 0 0 0 1 1 0 0 1 0 1 0 1 0 0 1

BINARY (3b) PATTERNS: a1a2a3 a1a2a3 a1a2a3 a1a2a3 a1a2a3 a1a2a3 a1a2a3
0 0 0   0 1 1   0 0 1   1 0 0   1 1 0   1 0 1   0 1 0   1 1 1

BINARY VALUE: 000011001101010111

AB = 11: FRAMING PATTERN

AB = 11: FRAMING PATTERN

FIG. 2C

| BINARY PATTERN $a_1a_2a_3$ | CODED PATTERN $b_1b_2b_3b_4$ | |
|---|---|---|
| 000 | 0000 | c0 |
| 001 | 0001 | c1 |
| 010 | 0010 | c2 |
| 011 | 0100 | c3 |
| 100 | 0101 | c4 |
| 101 | 0110 | c5 |
| 110 | 1000 | c6 |
| 111 | 1001 | c7 |

ENCODING ↓ ↑ DECODING

CODE TABLE

METHOD AND APPARATUS FOR TRANSMISSION ON A 2-BIT CHANNEL USING 3B/4B CODE

CROSS REFERENCE TO RELATED PATENT APPLICATIONS

The present application claims priority of the Provisional Application Ser. No. 60/276,739, filed Mar. 16, 2001.

Patent application Ser. No. 10/095,489 entitled "Scalable Interface and Method of Transmitting Data Thereon", assigned to the assignee of the present invention describes a scalable interface using the 2-bit channel and 3 b/4 b coding.

BACKGROUND OF THE INVENTION

1) Field of the Invention

The present invention relates to communications networks in general and in particular to apparatus and techniques used to interconnect components within devices coupled to said communications networks.

2) Prior Art

The proliferation of communication devices has created the need for uniform standards to which a manufacturer is obliged to observe in order to interconnect one manufacturer's equipment to the equipment of another manufacturer. The standards are, usually, not mandatory. But a manufacturer whose equipment does not comply with an adopted standard may not be able to communicate with equipment from other manufacturers. As a consequence, the sale of equipment from the non-complying manufacturer may be less than it would have been if he had complied.

As a consequence it is common industry practice for manufacturers to form working groups which promulgate standards pertaining to a particular technology. The Optical Internetworking Forum (OIF) is one of such working group which promulgates standards for OC-192 System Interface for Physical and Link Layer Devices. The interface is often referred to as the SPI-4 interface which interconnects Physical Layer (PHY) devices to Link Layer devices for 10 Gbps for aggregate bandwidth applications. Details of the SPI-4 interface is set forth in the OIF document entitled: "System Packet Interface Level 4 (SPI-4) Phase 2: OC-192 System Interface for Physical and Link Devices" or its successor documents which can be obtained from Optical Internetworking Forum, 39355 California Street, Suite 307, Fremont, Calif. 94538 or successor organization and is incorporated herein by reference.

Figure 1:
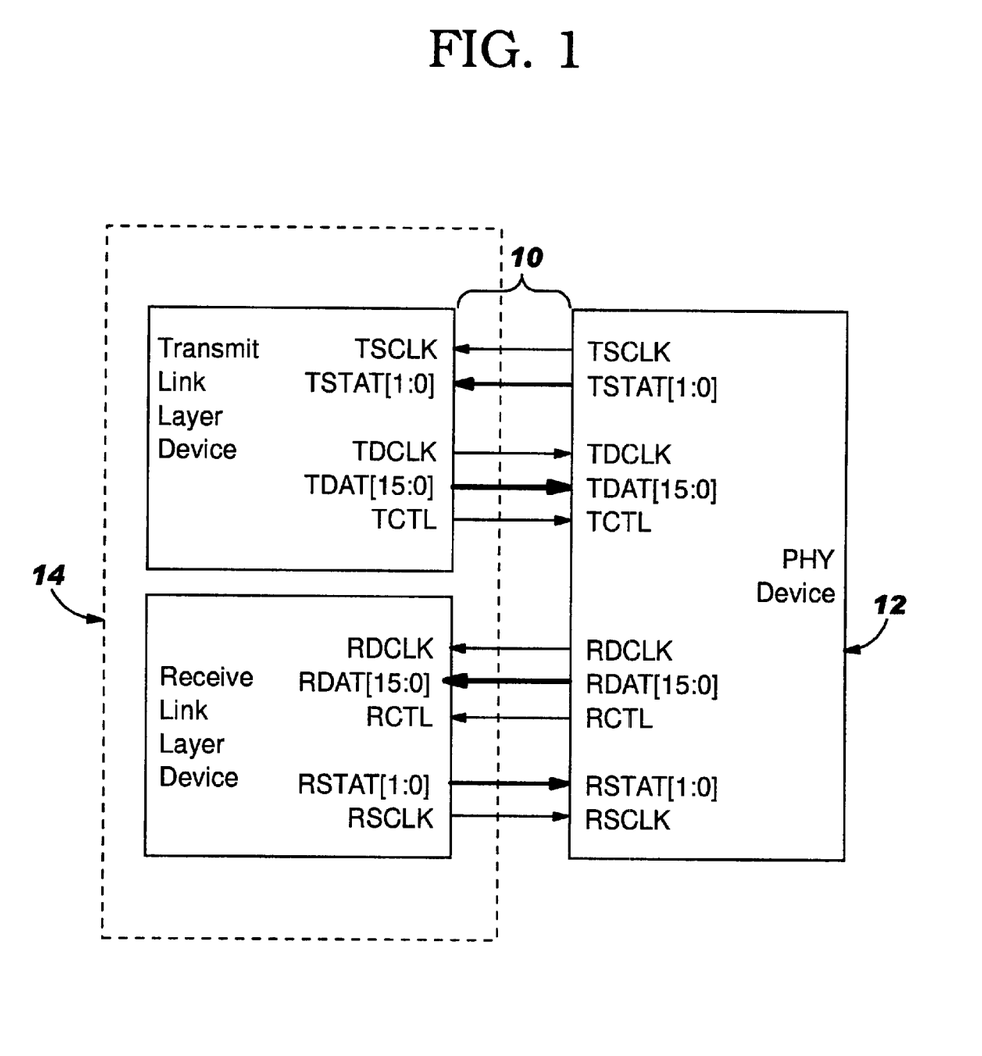
FIG. 1 is a block diagram showing the SPI-4 Interface coupling a PHY device to link layer device.

In order to set the background against which the present invention was developed portions of the SPI-4 Interface standard are described with reference to FIG. 1. The SPI-4 interface 10 is a Point-to-Point interface coupling PHY Device 12 to Link Layer Device 14. The Link Layer Device 14 includes Transmit Link Layer Device and Receiver Link Layer Device. The SPI-4 Interface 10 includes transmitting data clock (TDCLK), transmit data (TDAT) and transmit control (TCTL). The named signals are from the Transmit Link Layer Device to PHY Device 12. Likewise, SPI-4 Interface 10 includes receive data clock (RDCLK), receive data (RDAT) and receive control (RCTL) from PHY Device 12 to the Receive Link Layer Device. Associated with the RDCLK, RDAT and RCTL are RSTAT and RSCLK. RSTAT is a 2-bit channel transmitting status information from Receive Link Device to PHY Device 12. Clock signal associated with the 2-bit channels is transported on RSCLK. A 2-bit channel labelled TSTAT and clock line labelled TSCLK associated with TDCLK, TDAT and TCTL, carries status information from PHY Device 12 to Transmit Link Layer Device. The arrows in FIG. 1 indicate the direction in which information flows.

The RSTAT channel, RSCLK, TSTAT and TSCLK relate to the present invention set forth herein below. As a consequence further discussion will be limited thereto. Except for flow direction, the characteristics and functions of TSCLK, TSTAT and RSTAT, RSCLK are identical. Therefore, only one set or pair will be described with the understanding that the description relates to both pairs.

As defined in the standard the Status Channel (TSTAT or RSTAT) is a 2-bit digital channel with four unique bit patterns 00, 01, 10 and 11. The bit pattern '11' is the synchronization character and cannot be used to transmit useful information. In fact, only three bit patterns 00, 01, and 10 are available to transfer useful information. However, there are several situations requiring more than 3 (three) 2-bits independent bit pattern to transmit more complex information on the two bit status channels. As a consequence, there is a need to provide more independent bit patterns on the two bit status channel without altering its characteristics such as changing the '11' synchronizing bit pattern.

SUMMARY OF THE INVENTION

The present invention increases the efficiency on the two bit channel by increasing the number of independent bit patterns that can be used to transfer information. The increase is achieved without changing the clocking set forth in the above-identified document or '11' synchronization bit pattern. The bit pattern is increased by using a 3 b/4 b coding and not using predetermined bit patterns with '11', located in certain positions of the patterns, to transmit data.

In particular a digital stream of data to be transmitted on the 2-bit channel is partitioned into groups of 3 bits which are encoded into 4 bits and forwarded onto the channel in pairs using back-to-back clock cycles. Selected bit patterns with '11' in adjoining pairs of each serial string of 4 bit pattern are discarded and not used to transmit information on the 2-bit channel. Contiguous clock cycles are used to gate pairs of the coded 4 bits onto the status channel.

BRIEF DESCRIPTION OF THE DRAWINGS

FIG. 2, consisting of FIGS. 2A, 2B and 2C, shows a graphical representation of the coding scheme according to the teachings of the present invention.

DESCRIPTION OF THE PREFERRED EMBODIMENT

Figures 2A, 2B:
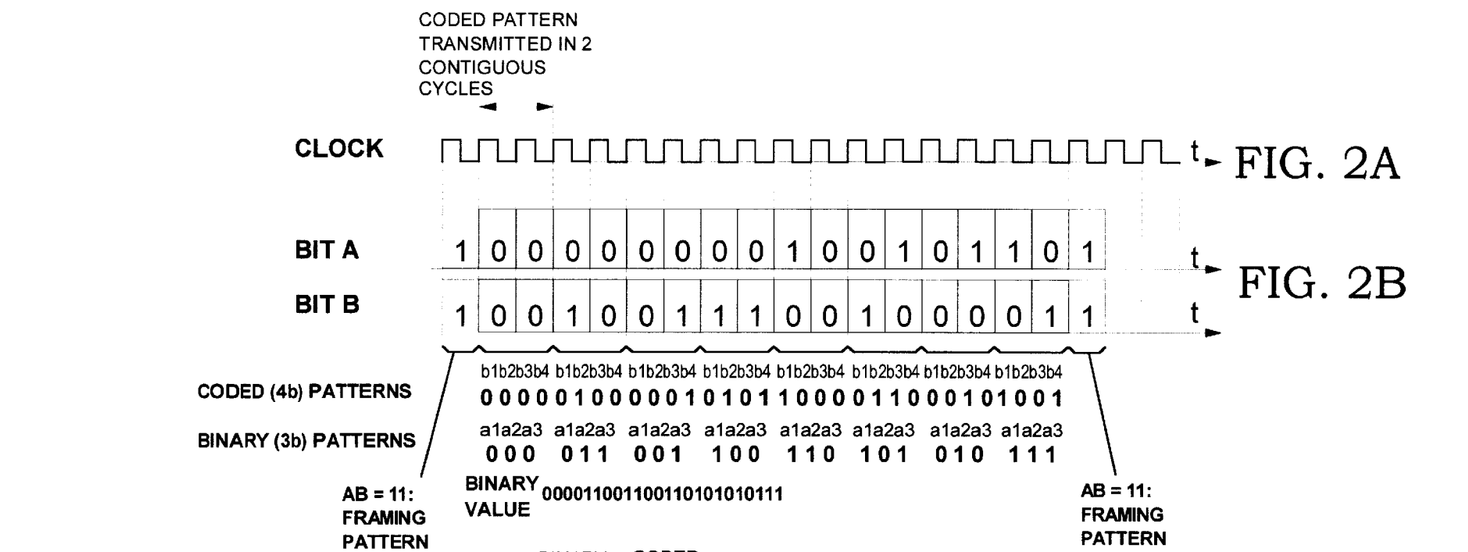
Figure 2C:
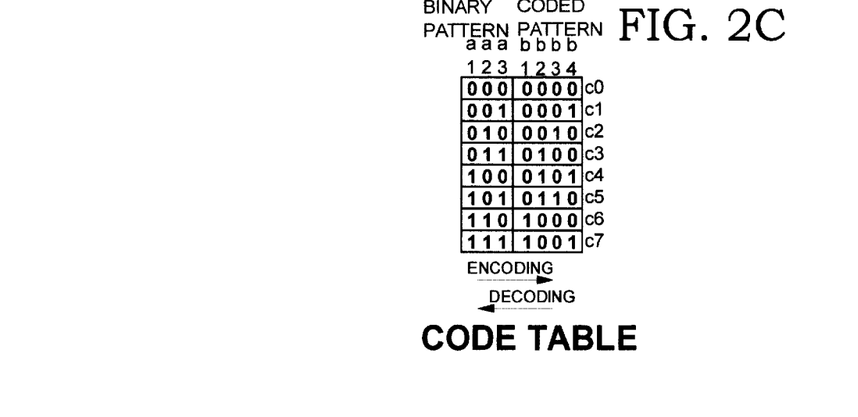

FIG. 2, consisting of FIGS. 2A, 2B and 2C, shows a graphical representation of the coding scheme according to the teachings of the present invention. FIG. 2A shows the clock which is transmitted on the timing channel associated with the status channel and transmits timing signals that delineate bits on the status channel. As is shown in FIG. 2A two contiguous cycles of clock pulses on the timing channel is used for gating each of the four transmitted bit patterns in the status channel.

FIG. 2B shows a graphical representation of the status channel labelled Bit A and is Bit B. The status channel transmits status information from the sink to the source of the transmission. Turning to FIG. 1 for the moment for signals transmitted from Transmit Link Layer Device over TDCLK, TDAT and TCTL to the PHY Device, the Transmit Link Layer Device is the source and the PHY Device is the sink. Likewise, for signals transmitted from PHY Device to Receive Link Layer Device over RDCLK, RDAT and RCTL, PHY Device is the Source and Receive Link Layer Device is the Sink.

Referring again to FIG. 2, the status channel is a 2-bit channel described in the SPI-4 interface, incorporated herein by reference. The channel can be two wires, optical or any other type of transmission medium. The channel transmits a pair of '11' bits which are used for framing or delimiting a data structure in the channel. Data transmissions on the channel are coded as 4 b patterns transmitted in pairs of two transmitted in two contiguous clock cycles. For example, the transmission patterns are b1b2b3b4 transmitted in pairs. As a consequence, for any transmission pattern b1b2 is transferred in the first cycle followed by b3b4 in the second contiguous cycle. Each pair is transmitted in parallel in the transmission channel. Because this is a 3-bit 4-bit coding scheme each group of 3 bits to be transmitted on the channel are coded into 4 bits. For example, if a string of binary characters labelled BINARY VALUE (FIG. 2) is to be transmitted in the 2-bit channel, it is first partitioned into groups of 3 bits ($a_1$ $a_2$ $a_3$). In FIG. 2 the first group would be '000', the second group would be '011', the third group would be '001' and so forth. Because the binary length is 24 bits eight 3-bit binary patterns are generated and each 3-bit binary pattern is encoded into 4 bits and transmitted in parallel on the channel. At the receiver the reverse is practised. The 4 bits are received from the channel, decoded into 3 bits and then converted back into the digital string.

FIG. 2C shows a code table for the binary patterns and coded patterns. Each of binary patterns contains 3 bits (a1a2a3). Because 3 bits are in the group the number of independent binary patterns would be $2^3=8$. The 8 values are shown in the table from '000' to '111'. The table also shows the coded patterns. In a similar manner the number of independent coded patterns generated from 4 bits would be $2^4=16$.

However, not all of the 16 unique patterns can be used because '11' is the framing pattern and cannot appear in certain positions of the coded patterns transmitted in the status channel. As a consequence, the framing pattern '11' cannot be present in b1b2 or b3b4. However, this pattern can be present in b2b3 as is shown in c5 of the table. When the ineligible coded patterns are removed from the 16 available coded patterns the 8 patterns shown in the coded table are available for transmitting information on the status channel. The coded patterns that are not available for transmitting information include 0011, 0111, 1011, 1100, 1101, 1110 and 1111. It should be noted that 1010 is an eligible pattern but is not used in the Code Table.

As can be seen in FIG. 2C the arrow labelled Encoding goes from left to right and illustrates that each of the binary patterns is coded into a specific 4-bit pattern. Likewise, the decoding goes from right to left and illustrates that each of the coded patterns is decoded into the corresponding 3-bit binary pattern shown in the table. Thus, by partitioning a digital string into 3 bits, coding the 3 bits into 4 bits and transmitting the 4 bits down a 2-bit status channel provides the mechanism wherein a large amount of information can be transmitted on a 2-bit channel. This the prior art SPI-4 2-bit channel could not have done. Therefore this invention significantly improves and adds value to the prior art scheme set forth in SPI-4 standard.

Figure 3A:
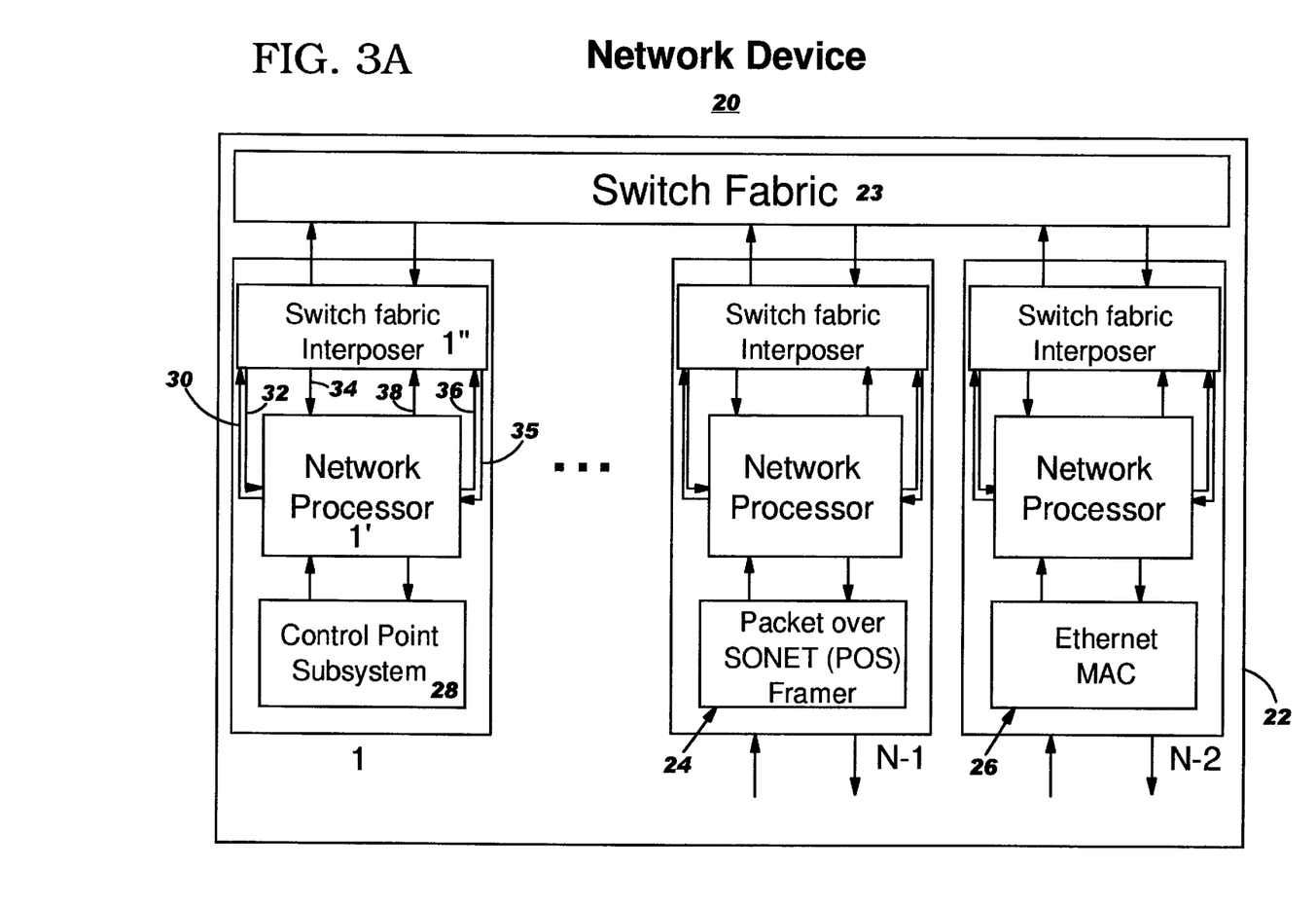
FIG. 3A shows a block diagram of a system including the teachings of the present invention.

FIG. 3A shows Network Device 20 in which the present invention is implemented. Network device 20 may be a switch router or any of the other conventional network devices. The Network Device 20 includes a housing 22 in which a plurality of blades labelled 1 through N, N-1, and N-2 are mounted. The blades are interconnected by Switch Fabric 23. Except for management blade 1 the blades are interconnected through appropriate network interfaces to different types of communications networks. For example, in FIG. 3 blade N-1 is connected through media interface 24 to an appropriate communications network. In particular, interface 24 is labelled "Packet over SONET (POS) Framer" which is an interface for handling information to and from an optical network. Likewise, interface 26 labelled "Ethernet MAC" handles communications with an ethernet network. The management blade 1 provides management for the overall network device. To this end, it includes a control point subsystem 28 that performs most if not all of the management functions and/or functions that cannot be performed by the other blades. The function provided by control point subsystem 28 is well known in the art, therefore further description of the function will not be given. Suffice it to say that the control point subsystem 28 could be a general purpose computer shown in FIG. 3B.

Figure 3B:
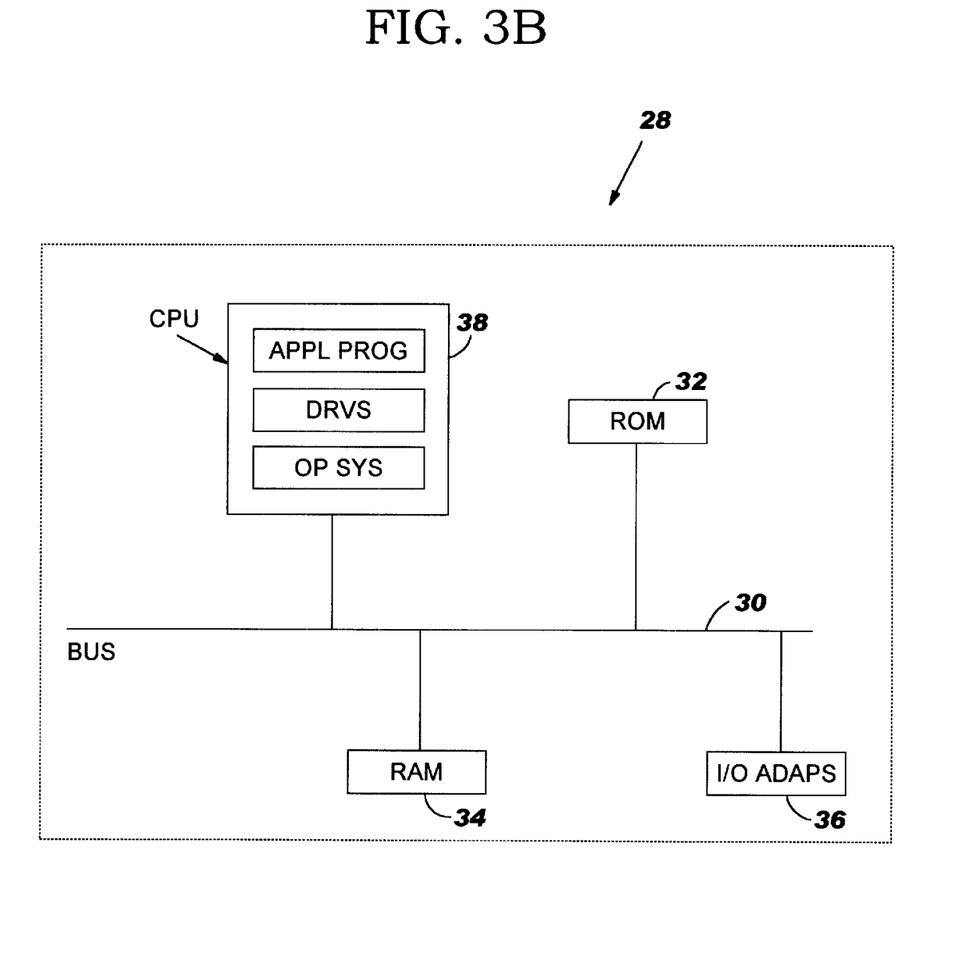
FIG. 3B shows a block diagram of the Control Point Subsystem.

Turning to FIG. 3B for the moment, the control point subsystem 28 includes bus 30 to which ROM 32, RAM 34, I/O Adapters 36 and CPU 38 are connected. The RAM is used as a scratch pad by the system whereas the ROM stores instructions. I/O Adapter 36 can be used to attach external devices such as a mouse, keyboard, scanner, etc. The CPU 38 includes an operating system, drivers and application programs. The functions which each of these entities provides are well known in the art and will not be discussed further.

Referring again to FIG. 3A, each of the blades includes a Network Processor coupled by a switch fabric interposer to the Switch Fabric 23. The Switch Fabric 23 could be a cross-point switch which provides communication between the various blades in the device. The switch fabric interposer provides the interface between the network processor and the Switch Fabric 23. Among the functions provided by the switch fabric interposer is the structuring of data so that it can be exchanged between the network processor and the Switch Fabric 23. For example, the switch fabric uses a cell type data unit such as that used in ATM technology. The switch fabric interposer would package data from the network processor to the switch into the cell size used by the switch and generate the necessary control that is required for the switch to work in an acceptable manner. Likewise, data from the Switch Fabric 23 is converted into a format that the network processor understands. The Switch Fabric 23 can be any cross-point packet switch such as the switch termed PRIZMA manufactured and marketed by IBM Corporation. Because the network processor on each of the blades are the same, only one will be discussed. The network processor 1' is coupled to the switch fabric interposer 1" by transmit data bus 30, flow control in status channel 32 and flow control in clock channel 34. Transmit data channel 30 transmits data from network processor 1' to the switch fabric interposer 1".

Flow CTL IN status channel 32 transmits status information from the switch fabric interposer 1" to network processor 1'. Likewise, flow control in clock channel 34 transmits the clocking signals shown in FIG. 1A from the switch fabric interposer 1" to network processor 1'.

Still referring to FIG. 3A, network processor 1' is also connected to switch fabric interposer 1" by receive data bus 35, flow control out status channel 36 and flow control out timing channel 38. Receive data bus 35 transmits data from the switch fabric interposer 1" to network processor 1'. Flow control out status channel 36 transmits status information from network processor 1' to switch interposer 1". Flow control out timing channel 38 transmits the timing pulses that are associated with flow control out status channel 36. The interconnection of the other network processors, their operation etc., with their respective switch fabric interposer are identical to those described relative to blade 1. Therefore, further description of the interconnections will not be given it being understood that the interconnections and description for blade 1 is intended to cover the network processors and interconnection relative to the other blades.

Figure 4:
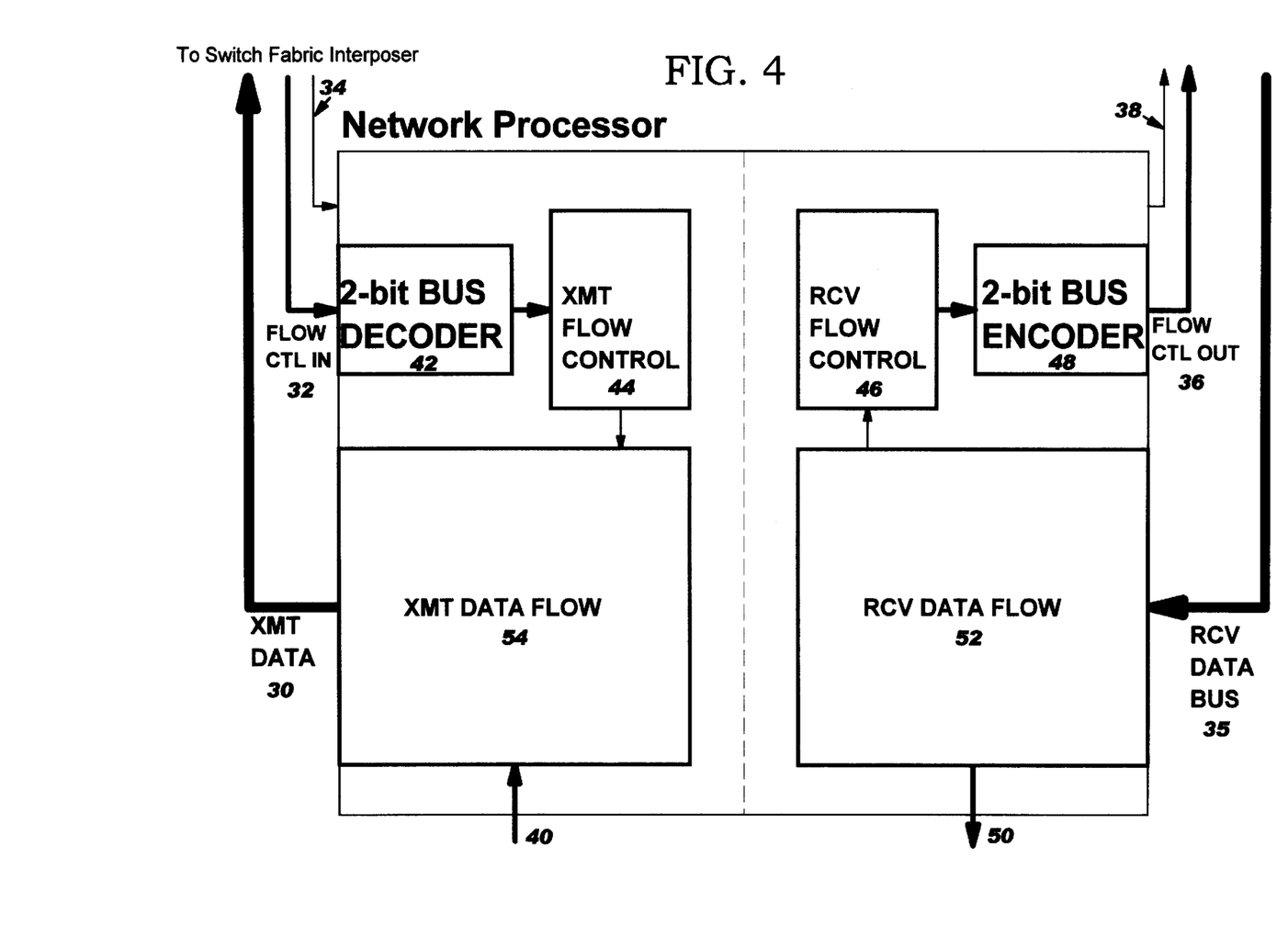
FIG. 4 shows a block diagram of a network processor including the teachings of the present invention.

FIG. 4 shows a block diagram of a network processor identifying only the parts which are germane to the present invention. The media interconnecting the network processor to its respective switch fabric interposer are identified by the same numerals used to identify these interconnections in FIG. 3. The network processor is a device that performs several network functions including address translation, quality of service management, classification of received packets, and other functions. The network processor is a known network device and details of this device can be obtained from application Ser. No. 09/384691. As a consequence, only those portions of the network processor germane to the present invention will be discussed further. The network processor includes transmit data flow 54 receiving data on input bus 40 and outputting the data on transmit data bus 30 to switch fabric interposer. The switch fabric interposer in turn returns status information, including indication of the level of congestion experienced by switch resources allocated to each of the destinations through the switch, on flow control status channel 32.

The timing signals are also returned on clock channel 34. The 2-bit bus decoder 42 receives the status information and clock and decodes them in the way described above. An output signal of the digital data stream generated from the received coded information is transmitted to flow control 44. The transmit flow control 44 output control signals which prevent the transmit data flow 54 from sending data during receipt of negative status information. Stated another way the decoded information from the status channel 32 is used to regulate data output from the transmit (XMIT) Data Flow 54.

Still referring to FIG. 4, the Receive side of the Network Processor replicates the reverse of what happens on the Transmit side. In particular, data from the switch fabric interposer is received on receive data bus 35 and forwarded into receive data flow 52. The receive data flow 52 outputs control signals, into the receive flow control 46, which indicates the congestion status of resources within the RCV Data Flow 52. For example, the control signals may give congestion status of queues etc. The RCV Flow Control 46 converts the control signal into a digital stream of bits from which encoder 48 generates the status and clocking information that is transferred to the switch fabric interposer informing said switch fabric interposer of congestion status in the receive data Flow 52. Because the switch fabric interposer knows the congestion status of resources in the RCV Data Flow 52, the Switch Fabric interposer can adjust data on the RCV Data Bus 35 so as not to overflow resources in the RCV Data Flow 52.

Figure 5:
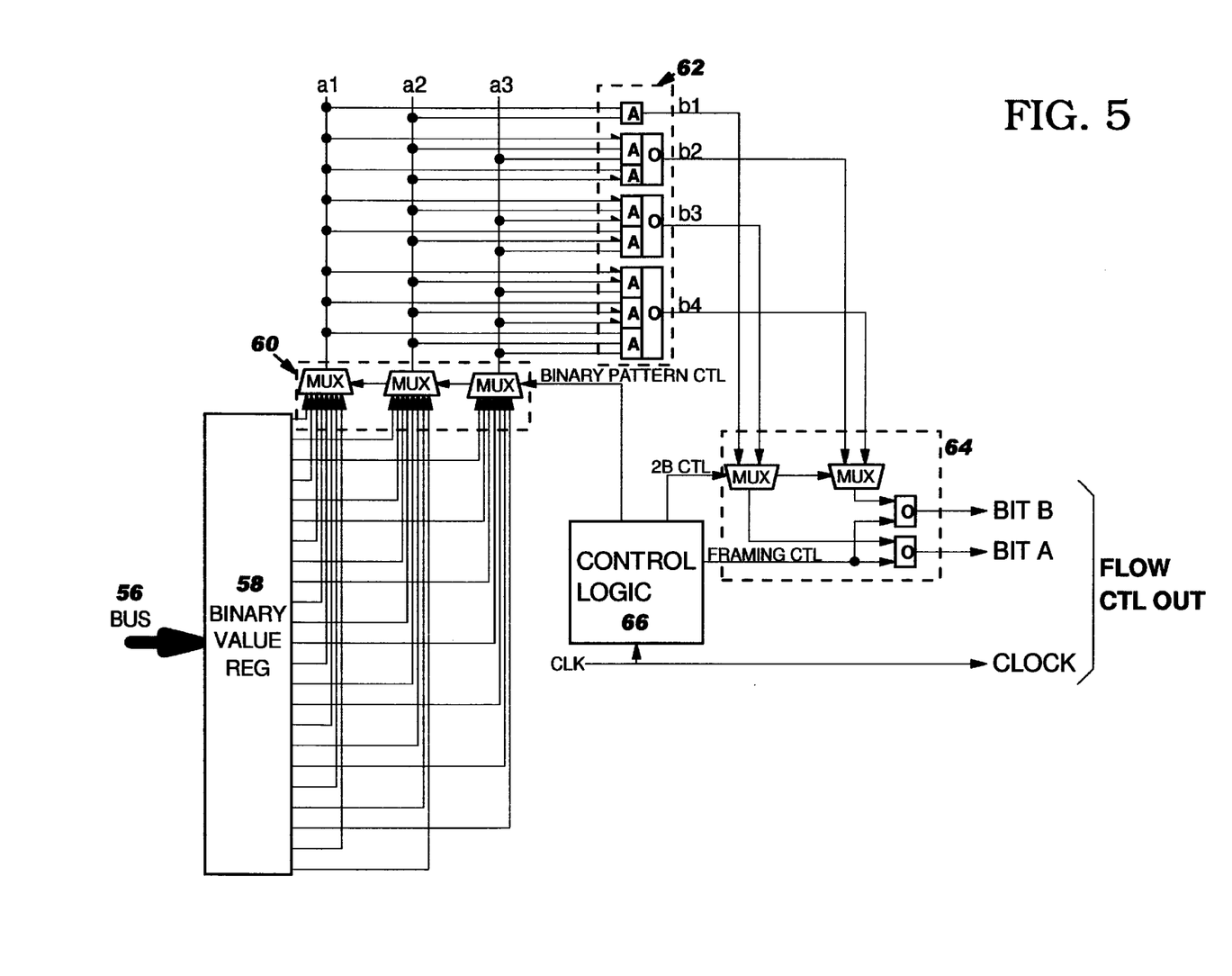
FIG. 5 shows a logic circuit arrangement for the Encoder.

FIG. 5 shows a block diagram of the encoder logic according to the teachings of the present invention. The encoder logic receives a digital data string, for example on bus 56 partitions the digital data string into groups of 3-bits which are converted into groups of 4 bits and transferred with appropriate clocking signals on the 2-bit status channel. To this end the encoder includes binary value register (reg) 58 which has several register positions to buffer the digital string from bus 56. Partition logic 60, including N MUXes partitions the data into groups of three (a1, a2, a3) bits. As shown in FIG. 5, N is equal to 3; and, with reference to FIG. 1 assuming the binary value of the data stream is 24 bits, 3 MUXes would handle 8 bits to generate the binary patterns a1, a2, a3. The binary patterns a1, a2, a3 are fed into pattern generation logic 62 which generates the coded pattern b1 b2 b3 and b4. In the embodiment shown in FIG. 5 b1 is generated by the AND gate, b2 b3 are generated by a two-way AND/OR gate and b4 is generated by a 3-way AND/OR gate. The coded patterns b1 b2 b3 and b4 are fed into selection logic 64 which includes two MUXes and two OR gates, each one generating Bit A and Bit B, respectively. The Control Logic 66 receives a clock which is transmitted on the clocking channel and is used to generate the necessary control signal used to gate the MUXes in the partitioning logic 60 and the MUX and OR gates in selection logic 64. It should be noted that the framing pattern '11' on the status channel is generated by the Control Logic 66 and the OR gates within selection logic 64.

Figure 6:
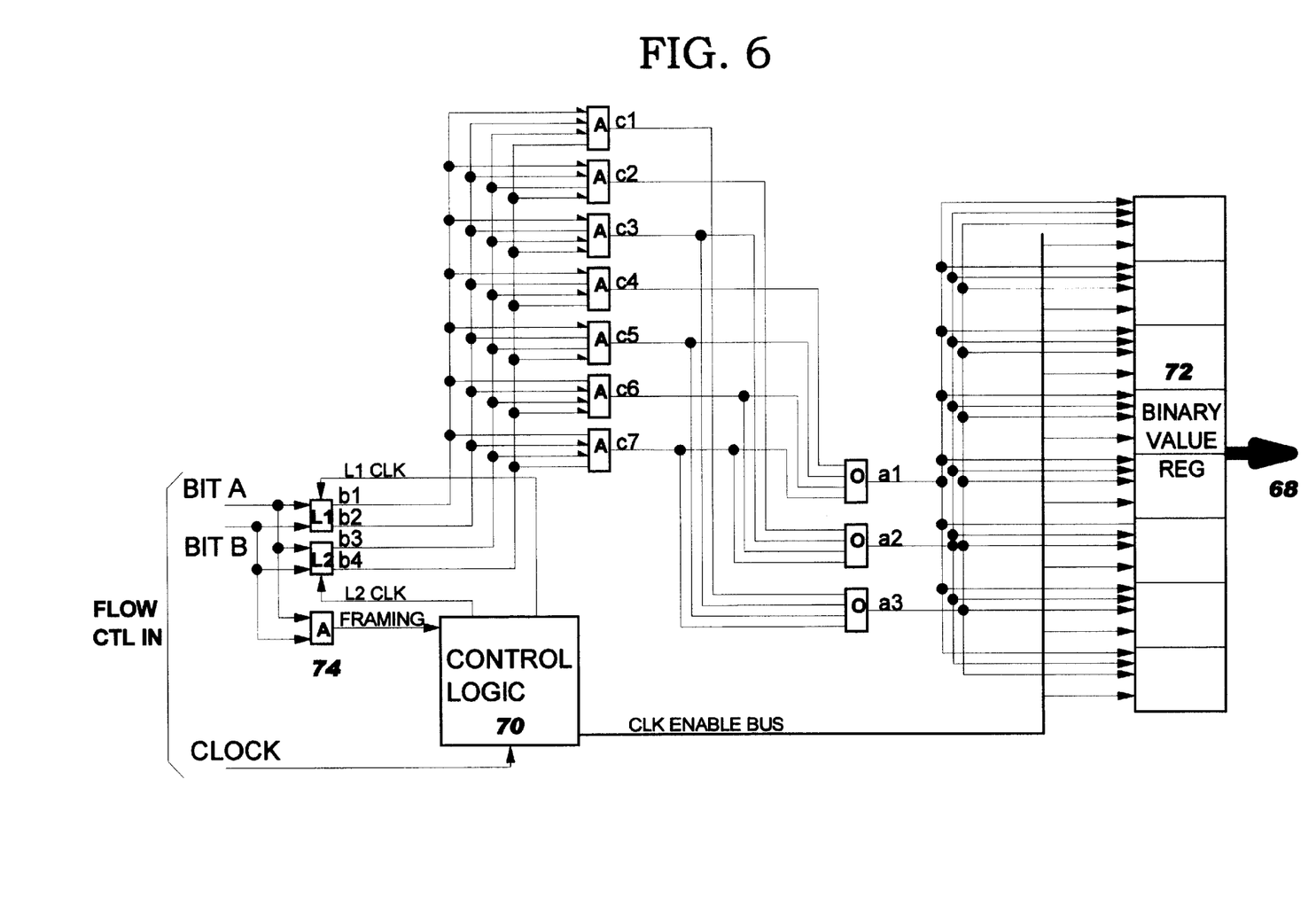
FIG. 6 shows a logic circuit arrangement for the Decoder.

FIG. 6 shows the logic circuit for the decoder. As stated above the decoder receives 4 bits and clock signals from the status channel and clock channel, converts the 4 bits into the 3-bit binary patterns and into the digital bit stream which is outputted on bus 68. The decoder includes control logic 70 which receives the clock from the clock channel and generates L1 clock, L2 clock and clocks on the bus labelled CLK Enable Bus. AND gate 74 detects the '11' bit framing signal which is outputted on the line labelled Framing and is used to reset the control logic 70. L1 clock and L1 latch generate the b1b2 coded patterns while L2 clock and L2 latch generate the b3b4 coded patterns. The output from the L1 and L2 latches are fed into AND gates labelled C1 through C7. The AND gates, whose negative inputs are indicated by a wedge, generate the pattern which is marked as C1 through C7 on the code table FIG. 2C. The output from respective AND gates are fed into a set of OR gates which generate the binary patterns a1 a2 a3. The binary patterns with the appropriate clock pulses on the clock enable bus clock the appropriate bit into Binary Value Reg 72 and onto bus 68.

A coding method and system is provided for enhancing the efficiency of data transmitted on a relatively narrow channel, such as a 2-bit channel. Although the present invention has been described in accordance with the embodiment shown one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for transmitting data comprising the steps of:
   partitioning a string of binary value data into groups of n bits; n being an odd integer;

converting each group of n bits into a corresponding group of n+a bits, wherein each group of n+a bits is selected from $2^{n+a}$ patterns and each of the selected group from the $2^{n+a}$ patterns does not have framing bits placed as adjoining pairs of bits in serial bit stream of selected group; and transmitting on a communications channel the selected groups from the $2^{n+a}$ patterns.

2. A method for sending data on a communications channel comprising the acts of:

(a) partitioning the data into groups of n-bits;

(b) identifying a first bit pattern that delimits units of information on said communications channel;

(c) converting each group of n-bits into corresponding groups of n+a bits, selected from $2^{(n+a)}$ bit patterns wherein none of the corresponding n+a bits include the first bit pattern in adjoining pairs of bits in each group; and (d) transmitting selected ones of the corresponding n+a bits onto the communications channel.

3. The method of claim 2 wherein n=3.

4. The method of claim 3 wherein a=1.

5. The method of claim 4 further including the act of transmitting a clocking signal to be used to recover said data from the communications channel.

6. The method of claim 5 wherein adjacent pairs of clock pulses in said clocking signal are used to send the corresponding n+a bits.

7. The method set forth in claim 6 wherein each clock pulse in the pair of adjoining clock pulses gates (n+a)/2 bits into the communications channel.

8. The method of claim 7 further including the acts of receiving from the communications channel groups of (n+a) bits;

converting each group of n+a bits into a group of n bits; and converting the group of n bits into a serial data stream.

9. A system including:

a source device;

a sink device;

a data transmission channel operatively coupling the sink device to the source device;

a first status transmission channel operatively coupling the source device to the sink device; and an encoder that converts 3 bits into 4 bits that are used to transmit status information on the status transmission channel from the source device to the sink device.

10. The system of claim 9 further including a binary register that receives a binary bit string operatively coupled to the encoder.

11. The system of claim 10 further including a clock channel that transmits clock signals to gate bits on the status channel.

12. The system of claim 11 wherein adjacent pairs of clock pulses on said clock channel gates the 4-bits on the status channel.

13. The system of claim 12 wherein each clock pulse in the adjacent pairs of clock pulses gates a pair of the 4-bits on the status channel.

14. The system of claim 10 wherein the encoder includes partitioning logic that partitions the binary bit string into groups of the 3-bit;

pattern generation logic responsive to convert each group of 3-bits into the 4-bits;

selection logic that selects pairs of bits in said 4-bits to be transmitted on the status transmission channel; and a control logic operatively coupled to the partitioning logic and the selection logic.

15. The system of claim 14 wherein the partitioning logic includes n multiplexors having multiple inputs connected to multiple positions of the binary value position register, a single output; and control signal to select the multiplexors.

16. The system of claim 14 wherein the pattern generation logic includes multiple two-ways AND/OR logic gates coupled in parallel to the partitioning logic.

17. The system of claim 14 wherein the selection logic includes a first multiplexor and a second multiplexor operatively coupled in parallel to the pattern generation logic; and a pair of OR gates coupled in parallel to the first multiplexor and second multiplexor.

18. The system of claim 9 wherein the source device includes a Network Processor.

19. The system of claim 18 wherein the sink device includes a Switch Fabric interposer.

20. The system of claim 19 wherein the status transmission channel includes a 2-bit bus.

21. The system of claim 9 further including a transmit data bus operatively coupling the source device to the sink device; and a second status control channel operatively interconnecting the sink device to the source device.

22. The system of claim 21 further including a decoder receiving groups of 4-bits that are converted into 3-bits and into a serial string.

23. The system of claim 22 wherein the decoder includes control logic that generates clocks;

4-bits logic generation circuit operatively coupled to the second status bus and responsive to clock signal from said control logic to generate groups of 4-bits; and 3-bit logic generation circuit responsive to groups of 4-bits to generate 3-bits therefrom.

24. The system of claim 23 further including a register operatively coupled to the 3-bit logic generation circuit; and clock signal from said control logic driving said register to output a digital bit string.

25. A method comprising the acts of:

(a) partitioning a string of binary digits into groups of 3-bits;

(b) encoding each group of 3-bits into corresponding 4-bits; and (c) transmitting selected ones of the 4-bits with at least one pair of the 4 bits being transmitted in parallel during a first clock cycle followed by another pair of said 4 bits during a second clock cycle.

26. The method of claim 25 wherein each group of the 3-bits is selected from a set including 000, 001, 010, 011, 100, 1001, 110 and 1001.

27. The method of claim 25 wherein each corresponding group of 4-bits is selected from a set including 0000, 0001, 0010, 0100, 0110, 1000 and 1001.

28. The method of claim 25 further including the acts of repeating (b) and (c) until all the groups of 3-bits of the partitioned string of binary digits are transmitted.

* * * * *